United States Patent
Nakamura et al.

[11] Patent Number: 6,072,749
[45] Date of Patent: Jun. 6, 2000

[54] MEMORY DEVICE PREVENTING A SLOW OPERATION THROUGH A MASK SIGNAL

[75] Inventors: Toshikazu Nakamura; Masato Matsumiya; Satoshi Eto; Masato Takita; Ayako Kitamoto; Kuninori Kawabata; Hideki Kanou; Masatomo Hasegawa; Toru Koga; Yuki Ishii, all of Kawasaki, Japan

[73] Assignee: Fujitsu Limited, Kanagawa, Japan

[21] Appl. No.: 09/166,070

[22] Filed: Oct. 5, 1998

[30] Foreign Application Priority Data

Mar. 31, 1998 [JP] Japan .................................. 10-084845

[51] Int. Cl.[7] ...................................................... G11C 8/00
[52] U.S. Cl. .................................. 365/238.5; 365/189.01; 365/230.03
[58] Field of Search ........................... 365/238.5, 230.03, 365/189.01, 189.04, 233

[56] References Cited

U.S. PATENT DOCUMENTS

| | | | |
|---|---|---|---|
| 5,148,396 | 9/1992 | Nakada | 365/189.03 |
| 5,629,899 | 5/1997 | Sato | 365/230.03 |
| 5,787,046 | 7/1998 | Furuyama et al. | 365/230.03 |

Primary Examiner—David Nelms
Assistant Examiner—David Lam
Attorney, Agent, or Firm—Arent, Fox Kintner Plotkin & Kahn

[57] ABSTRACT

This invention is a memory device with a structure that has eliminated the logic circuit using I/O mask signal DQM from within the critical path from the clock CLK to the predecoder and column decoder for generating column selection signal CL. The logic circuit using I/O mask signal DQM within the critical path for generating column selection signals is eliminated, and the time from when the clock is supplied until the column selection signal is generated is made as short as possible. On the other hand, to make an I/O mask possible during burst write mode, drive control of the write amplifier is performed based on I/O mask signal DQM. Specifically, activation of the write amplifier is prohibited or allowed in response to the I/O mask signal DQM.

10 Claims, 14 Drawing Sheets

FIRST EMBODIMENT

FIRST EMBODIMENT

TIMING CHART OF FIRST EMBODIMENT

SECOND EMBODIMENT

THIRD EMBODIMENT

THIRD EMBODIMENT

TIMING CHART OF THIRD EMBODIMENT

FOURTH EMBODIMENT

FOURTH EMBODIMENT

TIMING CHART OF FOURTH EMBODIMENT

1

MEMORY DEVICE PREVENTING A SLOW OPERATION THROUGH A MASK SIGNAL

BACKGROUND OF THE INVENTION

1. Field of the Invention

This invention relates to a memory device such as a semiconductor memory device, and specifically concerns a memory device that prevents the slowing of read operation through use of a mask signal used during burst write mode.

2. Description of the Related Art

Memory devices such as recent semiconductor memory devices have a burst mode that accesses memory cells of differing columns in a state with word lines selected by row addresses being driven. By using this burst mode, it is possible to read multiple read data at high speed in a short period of time, or to write multiple write data at high speed in a short period of time.

On the other hand, for this burst mode for which high speed access is possible, to make it possible to prevent reading or writing of specific data, an input/output mask signal (DQ mask) is used. Specifically, in the burst mode, when read or write is performed in succession synchronous with the clock, an input/output mask signal is allocated at the timing of a preset read or write number, and the write operation at the time of mask signal and the read operation at 2 clocks later from the mask signal is prohibited.

Generally, with memory devices, a bit line selected from multiple bit lines is connected to a common data bus by a column selection signal, read is performed from the main amplifier for reading which is installed in the data bus, or write is performed from the write amplifier also installed in the data bus. Therefore, to prohibit read or write using the aforementioned I/O mask signal, it is necessary to drive the column selection signal in response to the I/O mask signal.

FIG. 1 is a schematic diagram of part of a prior memory device. In this schematic diagram, mainly column side circuits and I/O parts are shown, and row circuits are omitted. Sense amplifier SA is installed adjacent to memory cell array MCA. In the diagram, the double square represents an external terminal, and external terminals for addresses A00 to Axx, I/O terminal DQ, clock CLK, and I/O mask DQM are shown. Addresses A00 to Axx are allocated to predecoder 14, and column selection signals CL0 to CL255 are generated by column decoder 16. Furthermore, column selection signal CL is generated synchronous with clock CLK.

Sense amplifier SA detects the electric potential of bit lines (not illustrated), and outputs read data to read data bus rdb in response to column selection signal CL. The read data of read data bus rdb is amplified by main amplifier 20 and output to I/O terminal DQ. On the other hand, write data is supplied from I/O terminal DQ and sent to write data bus wdb by write amplifier 18. Then, write data bus wdb is connected to the bit line (not illustrated) selected by column selection signal CL. As a result, data is written to a memory cell.

Furthermore, in order to put column selection signal CL in a non-select state in response to I/O mask signal DQM supplied from outside, logic circuit 30 is installed. This logic circuit 30 is controlled so that column selection signal CL is generated synchronous with the clock CLK timing while the generation of column selection signal CL is prohibited in response to the status of I/O mask signal DQM.

FIG. 2 is a burst write operation timing chart diagram for the memory device shown in FIG. 1. This example shows a 4-bit burst write mode. The write mode is synchronous with the rising edge of clock CLK at time t1, and during the four clock cycles thereafter, four write data are supplied. Column selection signals CL are generated successively synchronously with this. However, in response to I/O mask signal DQM supplied at the second clock cycle, generation of column selection signal CL is prohibited. As a result, data write of the second clock cycle is prohibited.

We must note that with the aforementioned memory device, there is a problem of read operation being slow. For memory devices, requests for acceleration of reading are generally greater than for writing. With the read operation of the aforementioned memory device, sense amplifier SA operates after a word line is driven, the column address is decoded and column selection signal CL is generated, the read data of sense amplifier SA is output to main amplifier 20, and data is output from I/O terminal DQ. Therefore, performing generation of the column selection signal CL as quickly as possible is necessary to increase the read speed.

As shown in FIG. 1, critical path 32 for generating this column selection signal CL passes from clock CLK through logic circuit 30, predecoder 14, and column decoder 16. Reducing the delay time of this critical path as much as possible makes it possible to accelerate the read operation.

However, as mentioned above, there is a logic operation with the status of I/O mask signal DQM in critical path 32, so it is not possible to sufficiently accelerate the generation of column selection signal CL.

SUMMARY OF THE INVENTION

Therefore, an object of this invention is to provide a memory device with a new structure which allows high speed reading.

Another object of this invention is to provide a memory device that accelerates generation of column selection signals, and that makes possible the operation of prohibiting I/O in response to the I/O mask signal DQM for the burst mode.

A further object of this invention is to provide a memory device that makes possible an optimal operation of prohibiting I/O using an I/O mask signal DQM for read and write operations.

To achieve the aforementioned objects, this invention is a memory device with a structure that has eliminated the logic circuit using I/O mask signal DQM from within the critical path from the clock CLK to the predecoder and column decoder for generating column selection signal CL. The logic circuit using I/O mask signal DQM within the critical path for generating column selection signals is eliminated, and the time from when the clock is supplied until the column selection signal is generated is made as short as possible. On the other hand, to make an I/O mask possible during burst write mode, drive control of the write amplifier is performed based on I/O mask signal DQM. Specifically, activation of the write amplifier is prohibited or allowed in response to the I/O mask signal DQM.

Or this invention relates to a memory device which includes a direct type sense amplifier type with which a drive circuit drives a data bus line in response to a bit line signal, and for which a read column selection signal and write column selection signal are generated. According to the invention, generation of the aforementioned write column selection signal is performed based on I/O mask signal DQM. Specifically, generation of a write column selection signal is prohibited in response to I/O mask signal DQM. On the other hand, the logic circuit using I/O mask signal DQM is not installed in the critical path for generating read column selection signals. Then, a circuit that prohibits (masks) output in response to I/O mask signal DQM is installed on the output side of the main amplifier for reading.

To achieve the aforementioned objects, according to the present invention, a memory device which has a burst mode that performs write and read of multiple bits synchronous with a clock, comprises:

a memory cell array including plural memory cells for storing data and plural bit lines connectable thereto;

a first column selection circuit that is opened or closed by a first column selection signal generated for each of the aforementioned bit lines;

a first data bus provided in common with the plural bit lines via the first column selection circuit;

a read main amplifier connected to the first data bus;

a second column selection circuit that is opened or closed by a second column selection signal generated during write operation;

a second data bus provided in common with the plural bit lines via the second column selection circuit; and a write amplifier that, in synchronous with the clock, drives the second data bus according to the written data so as to perform a write operation to the memory cells via the open second column selection circuit, wherein, in the burst write mode, the second column selection signal controls the second column selection circuit to be closed in response to a mask signal that requests prohibition of predetermined write operations.

There is a first column selection circuit used for reading and a second column selection circuit used for writing, mask signal logic is not inserted for generation of a first column selection signal that controls the first column selection circuit, and generation of a second column selection signal for controlling the second column selection circuit is prevented in response to a mask signal. By doing this, it is possible to accelerate the generation of first column selection signals that affect read operation speed. In the practical embodiment shown below, the first column selection signal corresponds to the read column selection signal, and the second column selection signal corresponds to the write column selection signal.

To achieve the aforementioned objects, according to the present invention, a memory device which has a burst mode that performs write and read of multiple bits synchronous with a clock, comprises:

a memory cell array including plural memory cells for storing data and plural bit lines connectable thereto;

a data bus provided in common with the plural bit lines via a column gate that is opened or closed by a column selection signal;

a read main amplifier connected to the data bus; and a write amplifier that, in synchronous with the clock, drives the data bus according to the written data so as to perform a write operation to the memory cells, wherein the write amplifier, in a burst write mode, is prohibited from driving the data bus in response to a mask signal that requests prohibition of a predetermined write operation, and the read main amplifier, in a burst read mode, is prohibited from outputting the read data in response to the mask signal.

With the aforementioned invention, the device is structured such that mask signal logic is not inserted for generation of the column selection signal so that generation is performed at high speed, and during burst write mode, drive operation of the write amplifier is prohibited in response to a mask signal. As a result, there is no loss of speed in generating column selection signals, which affects read operation speed, and it is possible to perform the operation of prohibiting write during the burst write mode as appropriate.

DESCRIPTION OF THE PREFERRED EMBODIMENTS

Following, we will use the Figures to explain embodiments of the invention. However, the technical scope of this invention is not limited by these embodiments.

Figure 1:
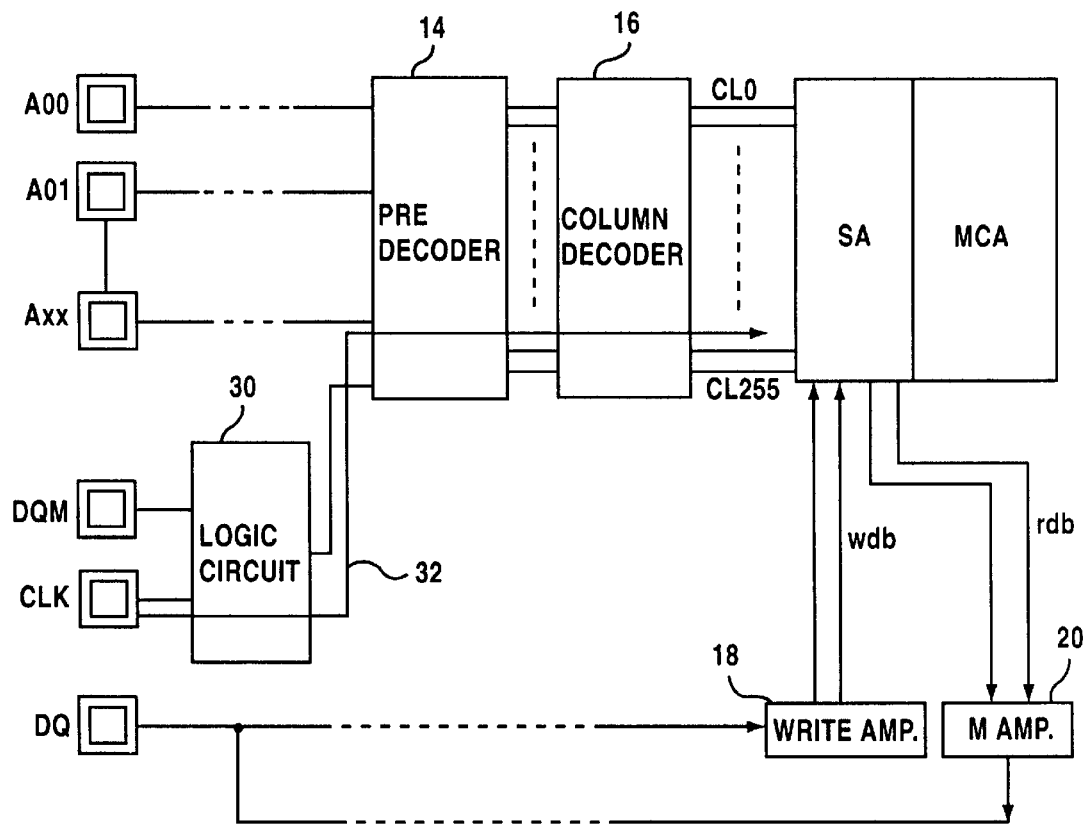
FIG. 1 is a summary diagram of part of a prior art memory device.
Figure 2:
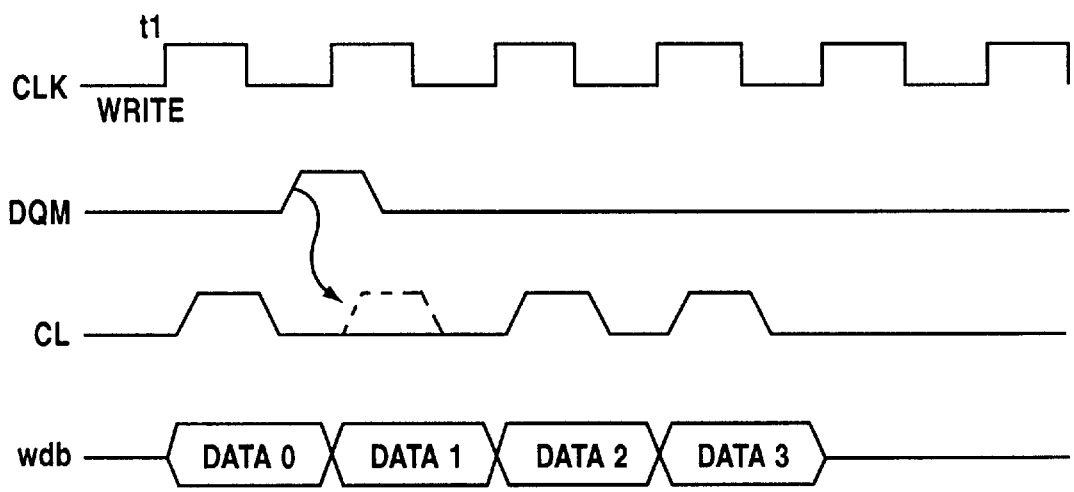
FIG. 2 is a timing chart diagram of the burst write operation of the memory device of FIG. 1.
Figure 3:
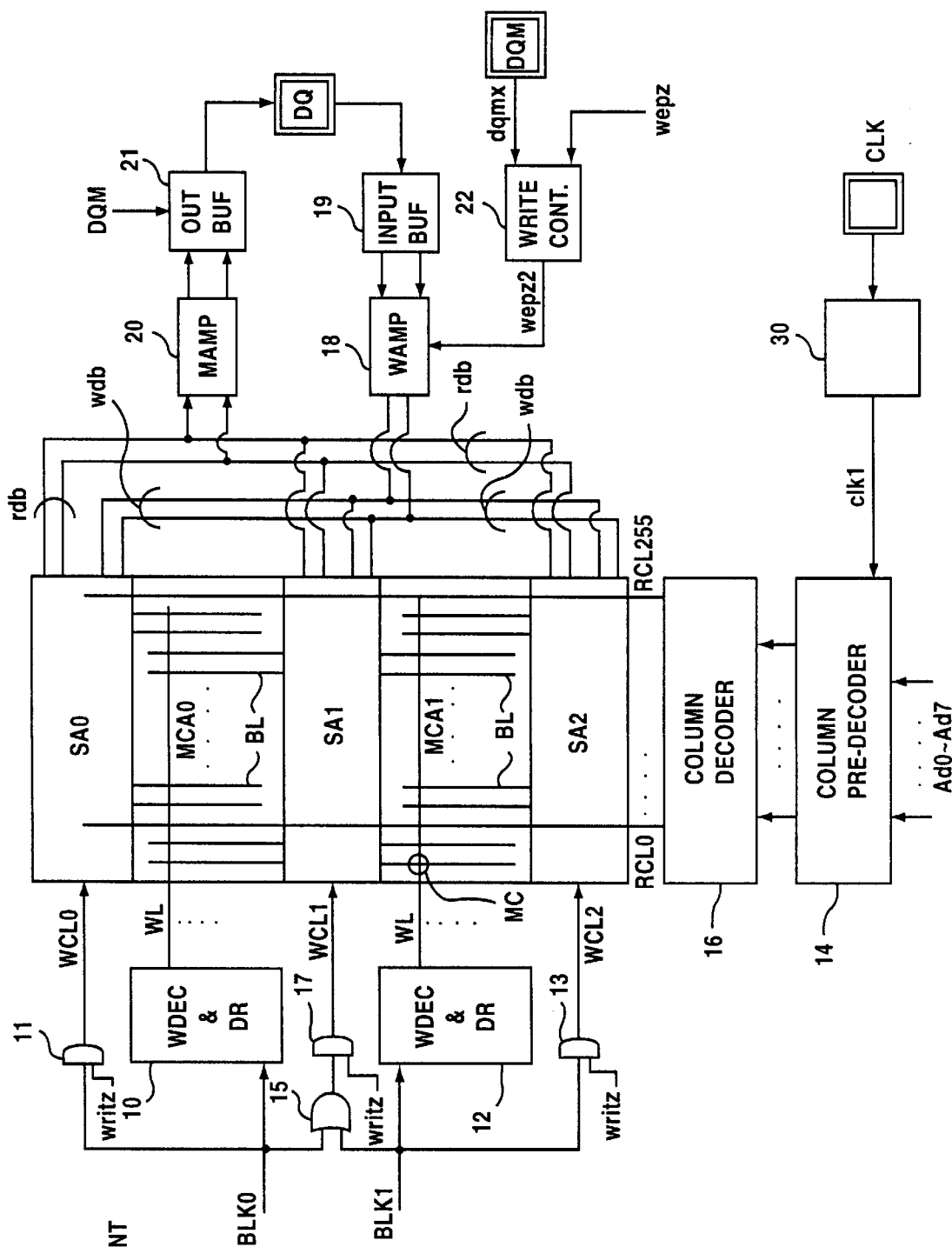
FIG. 3 is an overall circuit diagram of the memory device of a first practical embodiment of this invention.

FIG. 3 is an overall circuit diagram of a memory device of a first embodiment of this invention. In the circuit diagram shown in FIG. 3, two memory cell arrays MCA0 and MCA1 are provided in which plural word lines WL and plural bit lines BL are arranged, and at the intersections thereof are installed memory cells MC. Sense amplifiers SA0 to SA2 are provided at the top and bottom of each memory cell array MCA. For example, 256 pairs of bit line pairs are placed in memory cell array MCA, the odd numbered bit line pairs are connected to both sides of sense amplifier SA1, and the even numbered bit line pairs are connected to sense amplifiers SA0 and SA2 at both ends. By using this structure, it is possible to place sense amplifiers at the pitch of two bit line pairs, and a higher level of integration of the memory cell arrays is possible.

Word decoder driver 10 and 12 are installed in each memory cell array MCA0 and MCA1. At the same time row addresses (not illustrated) are supplied to these word decoder drivers 10 and 12, block selection signals BLK0 and BLK1 generated by a different row address are supplied. The word decoder driver on the side of the memory cell array to which this block selection signal BLK is given is activated, and word line WL of the corresponding memory cell array MCA is driven.

Now, if we assume that the memory cell in memory cell array MCA0 is selected, block selection signal BLK0 will be in a selected state, and one word line WL will be driven by word decoder driver 10. Along with this, the bit line pair within memory cell array MCA0 is connected to sense amplifier SA0 or SA1, and the potential difference of the bit line pair generated according to the charge accumulated in the memory cell is detected and amplified by the sense amplifier. On the other hand, word decoder driver 12 corresponding to memory cell array MCA1 goes to a non-activated state.

Then, column address signals Ad0 to Ad7 are supplied to column predecoder 14, addresses are decoded by predecoder 14 and column decoder 16, and one read column selection signal RCL is driven. Column predecoder 14 is activated in response to internal clock clk1 which is generated synchronous with clock CLK. Therefore, read column selection signal RCL is driven synchronous with clock CLK. Read column selection signal RCL is generated for each bit line pair, and in this example, there are 256 read column selection signal lines RCL.

Read data bus rdb and write data bus wdb are arranged in each sense amplifier SA0 to SA2. Then, read data bus rdb is driven in response to the signal of the bit line pairs and read column selection signal RCL. Also, write data bus wdb is connected to bit line pairs in response to read column selection signal RCL and write column selection signal WCL.

In the example shown in FIG. 3, write column selection signal WCL has signal WCL0 generated by AND logic (gate 11) of block selection signal BLK0 and write state signal writz, signal WCL1 generated by AND logic (gate 15) of the write state signal writz and an output of OR logic (gate 17) of block selection signals BLK0 and BLK1, and signal WCL2 generated by AND logic (gate 13) of block selection signal BLK1 and write state signal writz. In terms of actual function, as described above, write column selection signal WCL has a selection function by which a block is selected by a row address. Please note that to maintain consistency with embodiments described later, this signal which has a block selection function for writing will be called a write column selection signal.

Read data bus rdb is connected to main amplifier 20, the read data is amplified by main amplifier 20, and this is output to I/O terminal DQ via output buffer 21. I/O mask signal DQM is supplied to this I/O buffer 21, and in the burst read mode, specified bit output is prohibited in response to I/O mask signal DQM. Or, in response to I/O mask signal DQM, main amp 20 itself can be de-activated to prohibit output. In any event, it is necessary to prohibit output of read data in response to I/O mask signal DQM.

Write data supplied to I/O terminal DQ is supplied to write amplifier 18 via I/O buffer 19. Write amplifier 18 drives write data bus wdb, and writes data to the memory cell connected to the selected bit line.

In this embodiment, write control circuit 22 is installed for write amplifier 18. Mask signal dqmx generated from the I/O mask signal DQM terminal and internal write signal wepz indicating a write state are supplied this write control circuit 22, and write drive signal wepz2 is allocated to write amplifier 18. When write is prohibited by I/O mask signal DQM, generation of write drive signal wepz2 is prohibited for this write control circuit 22. Therefore, during burst write mode, it is possible to properly prohibit write operation in response to I/O mask signal DQM.

On the other hand, there is no logic circuit in response to I/O mask signal DQM in the critical path in which read column selection signal RCL is generated, this RCL affecting read speed. Specifically, with timing clock generating circuit 30, internal clock clk1 is generated synchronous with clock CLK, and read column selection signal RCL is generated by predecoder 14 and column decoder 16 in response to this internal clock clk1. Then, the output mask during burst read mode is performed at output buffer 21 on the output side of main amplifier 20. The logic of I/O mask signal DQM is not inserted for the generation of read column selection signal RCL.

The memory device shown in FIG. 3 is a synchronous type memory device for which the internal circuit operates synchronous with clock CLK. As described previously, timing clock generating circuit 30 that generates a clock such as internal clock clk1 in response to clock CLK is installed. Therefore, read column signal RCL is generated in response to clock CLK timing via predecoder 14 and column decoder 16. Therefore, read column signal RCL is generated from the timing of clock CLK in the shortest time.

Figure 4:
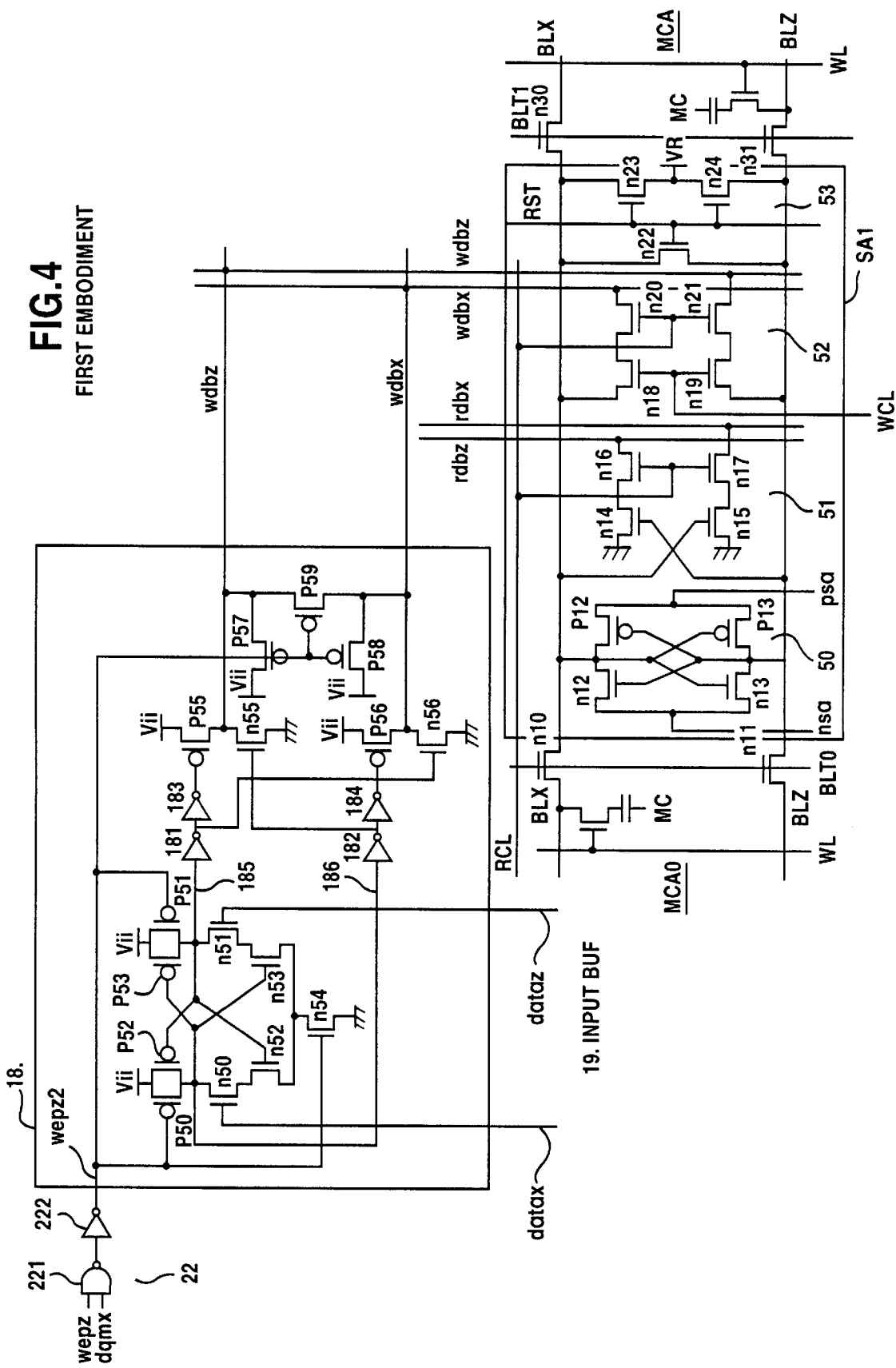
FIG. 4 is a detailed circuit diagram of the first practical embodiment.
Figure 5:
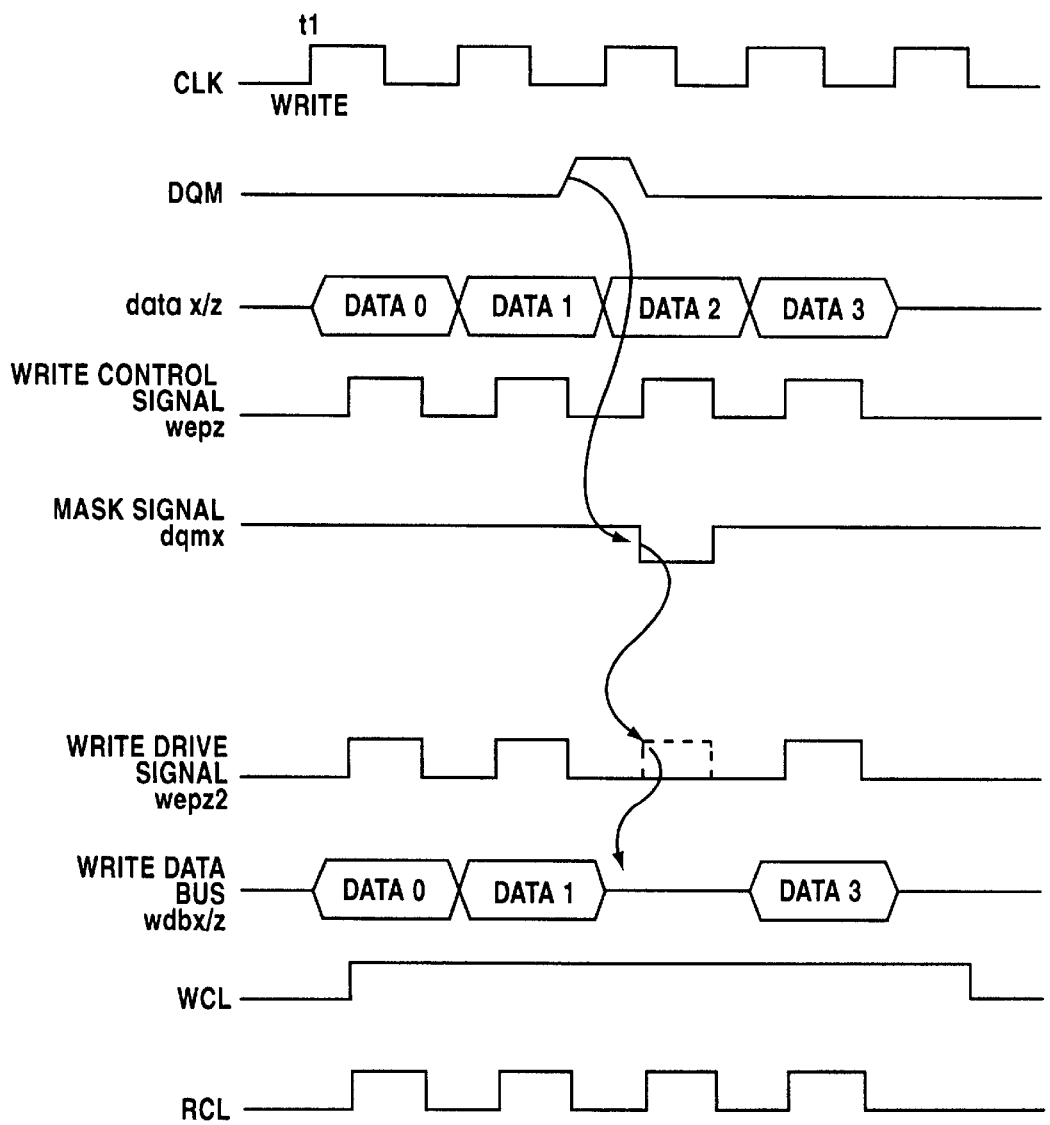
FIG. 5 is a timing chart diagram of the first practical embodiment.

FIG. 4 is a detailed circuit diagram of the first embodiment. The same reference numbers used in FIG. 3 have been allocated to the same parts. FIG. 5 is a timing chart diagram of the first embodiment. Memory cell array MCA0 and MCA1 as well as sense amplifier SA1 installed in common with these memory cell arrays are shown in FIG. 4. Word lines WL and bit line pairs BLx and BLz as well as the memory cells MC installed at the intersecting positions thereof in memory cell arrays MCA0 and MCA1 are shown. In this example, memory cell MC is formed from one transistor and one capacitor.

Bit line pairs BLx and BLz of memory cell arrays MCA0 and MCA1 placed on both sides are connected to sense amplifier circuit SA1 via bit line transfer transistor n10, n11, and n30, n31, respectively. These bit line transfer transistors n10, n11, and n30, n31 are made conductive by bit line transfer signals BLT0 and BLT1 generated from block selection signals BLK0 and BLK1, and bit line pairs BLx and BLz of the selected memory cell array side are connected to sense amplifier circuit SA1.

Sense amplifier circuit SA1 has amplifier circuit 50 made from P type transistor p12 and p13 and N type transistor n12 and n13 driven by sense amplifier drive signals psa and nsa, read column selection circuit 51, write column selection circuit 52, and reset circuit 53. Read column selection circuit 51 is made from N type transistors n14 to n17. When read column selection signal RCL is high level, transistors n14 and n15 each drive read data buses rdbx and rdbz according to the signals of bit line pairs BLx and BLz. Also, write column selection circuit 52 is formed from N type transistors n18 to n21, and when both write column selection signal WCL and read column selection signal RCL are high level, write data buses wdbx and wdbz are connected to bit line pairs BLx and BLz. Reset circuit 53 is formed from N type transistors n22 to n24, and in response to high level reset signal RST, the bit line pairs are shorted and equalized, and at the same time the bit line pairs are precharged to reset level VR.

As noted above, with sense amplifier circuit SA1 of the embodiment shown in FIG. 4, amplifier circuit 50 of the sense amplifier detects minute potential differences between bit line pairs BLx and BLz, and drives bit line pairs BLx and BLz. However, the bit line pairs are not connected directly to read data buses rdbx and rdbz, but rather data buses rdbx and rdbz are driven by transistors n14 and n15 by the electric potential of the bit line pairs. By using this structure, before sufficient potential difference is generated between bit line pairs BLx and BLz, it is possible to have read column selection signal RCL rise, so that higher speed read operation is possible. Also, since amplifier circuit 50 within sense amplifier circuit SA1 does not have to directly drive read data buses rdbx and rdbz, it is possible to reduce the drive load for amplifier circuit 50, and also possible to make read operation faster. The sense amplifier of this structure is called a direct sense type sense amplifier in this specification.

One special feature of the direct sense type sense amplifier circuit is that read column selection circuit 51 made from transistors n14, n15 and n16, n17 is installed to increase read operation speed. However, with the concerned read column selection circuit 51, the data bus and bit line pairs are not directly connected, and write operation is not possible, so a separate write column selection circuit 52 is installed. Then, with write column selection circuit 52, when both read column selection signal RCL and write column selection signal WCL are high level, write data buses wdbx and wdbz are connected to bit line pairs BLx and BLz, respectively, making write from write amplifier 18 possible.

Write amplifier 18 includes reset P type transistors p50 and p51, P type transistors p52 and p53 and N type transistors n50 through n54 forming an amplifier circuit driven by write data lines datax and dataz, and P type transistors p55 and p56 and N type transistors n55 and n56 that drive write data buses wdbx and wdbz. 181 through 184 are inverters. Also, P type transistors p57, p58, and p59 short write data buses wdbx and wdbz and form the reset circuit that drives up to power supply Vii. Moreover, this power supply Vii can be at ground potential, or can be at an intermediate potential between ground potential and power supply Vii.

With this write amplifier 18, when write drive signal wepz2 is low level (non-write drive state), P type transistors p50 and p51 are both made conductive, and both nodes 185 and 186 go to high level. As a result, transistors p55 and n55 as well as p56 and n56 become non-conductive. Also, reset transistors p57 through p59 are conductive, and write data buses wdbx and wdbz both are reset to the power supply Vii level.

If write drive signal wepz2 is driven to high level (write drive state), transistor n54 is conductive, and according to the level of write data lines datax and dataz from input buffer 19, one of nodes 185 and 186 is set to high level and the other is set to low level. Also, reset transistors p57 through p59 are in a non-conductive state. Then, in response to nodes 185 and 186, one of write data buses wdbx and wdbz is driven to high level and the other is driven to low level by transistors p55, n55, p56, and n56.

Write control circuit 22 in which write control signal wepz that controls write and mask signal dqmx generated from I/O mask signal DMQ are input is installed at the front of this write amplifier 18. Write control circuit 22 has NAND gate 221 and inverter 222, and the function thereof is to put the write drive signal wepz2 into a drive state (high level) if mask signal dqmx is in a non-masked state (high level) when write control signal wepz is in a write state (high level). Also, when write control signal wepz is in a write state (high level), if mask signal dqmx is in a masked state (low level), it puts write drive signal wepz2 into a non-drive state (low level). At this time, write amplifier 18 does not go to a drive state, write data buses wdbx and wdbz are not driven together, the reset level is maintained, and write to memory cell MC is prohibited.

We will explain the operation of the first embodiment while referring to the timing chart diagram of FIG. 5. At time t1, a write command is given, and a 4-bit burst write mode goes into effect. Then, I/O mask signal DQM is input at the third clock cycle, and the third bit write is prohibited.

After the write command is given, write data DATA0 to 3 input synchronous with clock CLK are supplied from input buffer 19 to write data line datax/z. From time t1, four write control signals wepz (high level) are generated synchronous with clock CLK. In response to this, write control circuit 22 generates write drive signal wepz2 (high level) synchronous with clock CLK. However, in response to the low level of mask signal dqmx generated from I/O mask signal DQM, write drive signal wepz2 maintains a low level at the third cycle. As a result, drive of write data buses wdbx and wdbz according to the third write data DATA2 is prohibited.

On the other hand, read column selection signal RCL is generated synchronous with clock CLK at the shortest delay time, and write column selection signal WCL maintains a selected state (high level) regardless of I/O mask signal DQM.

As described above, with the first embodiment, mask signal dqmx generated by I/O mask signal DQM masks the generation of write drive signal wepz2, and thus prohibits drive of write by the write amplifier of a specified bit number. Also, logic control by I/O mask signal DQM is not inserted into the read column signal RCL generating circuit.

Figure 6:
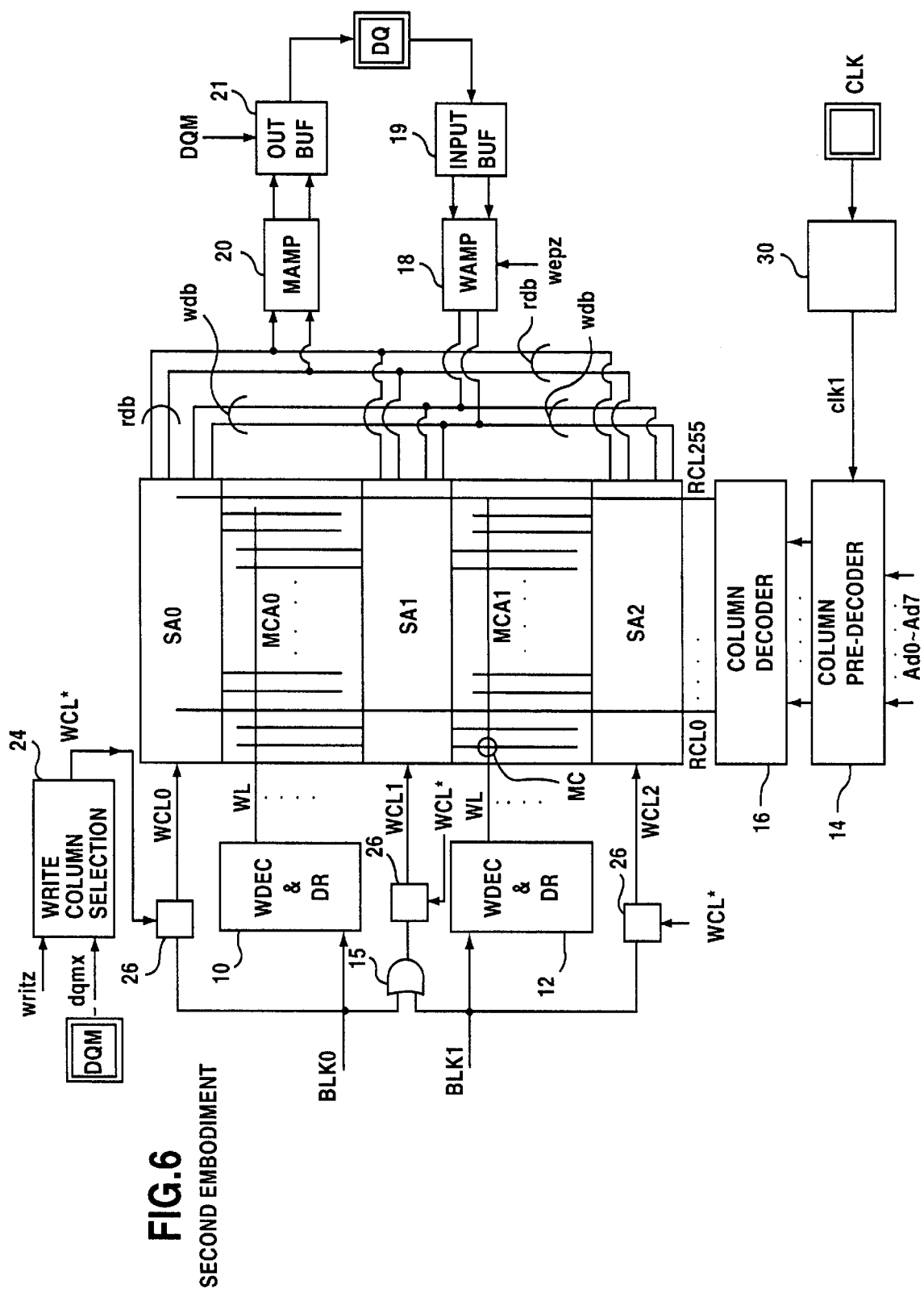
FIG. 6 is an overall circuit diagram of the memory device of a second practical embodiment.

FIG. 6 is an overall circuit diagram of a memory device of a second embodiment. Parts that are the same as those in FIG. 3 have been given the same reference numbers. The memory device shown in FIG. 6 also has sense amplifiers SA0, SA1, and SA2 installed on both sides of two memory cell arrays MCA0 and MCA1, read column selection signal RCL is placed in the column direction and is driven by column decoder 16, and write column selection signal WCL is placed in the row direction and is driven by block selection signal BLK.

The second embodiment differs from the first embodiment by the following points. With the second embodiment, write amplifier 18 drives write data bus wdb in response to write drive signal wepz. Specifically, in the burst write mode after the write command, a number of write drive pulse signals wepz correlating to the burst length are generated synchronous with clock CLK, and in response to this, write amplifier 18 drives write data bus wdb. Furthermore, with the second embodiment, write column selection signals WCL0 to WCL2 are controlled by mask signal dqmx generated from I/O mask signal DQM. Therefore, a selected state of write column selection signal WCL is prohibited at a timing specified by I/O mask signal DQM.

To realize the aforementioned write mask, write column selection control circuit 24 is installed. The write column selection control circuit 24 is supplied with mask signal dqmx generated from I/O mask signal DQM and write state signal writz which will be high level input in a write state. Even if in a write state, when mask signal dqmx is in a masked state (low level), write column selection signal WCL is in a non-selected state (low level). Each write column selection signal WCL0 to WCL2 is generated by AND circuit 26 into which block selection signal BLK and output signal WCL* from write column selection control circuit 24 are input. Therefore, when write column selection signal WCL corresponding to the block selected state is in a write state and not in a masked state, it goes to a selected state (high level). When write column selection signal WCL corresponding to the block selected state is in a masked state, even if it is in a write state, it goes to a non-selected state (low level).

Other than the points noted above, the memory device of the second embodiment shown in FIG. 6 is the same as the memory device shown in FIG. 3.

Figure 7:
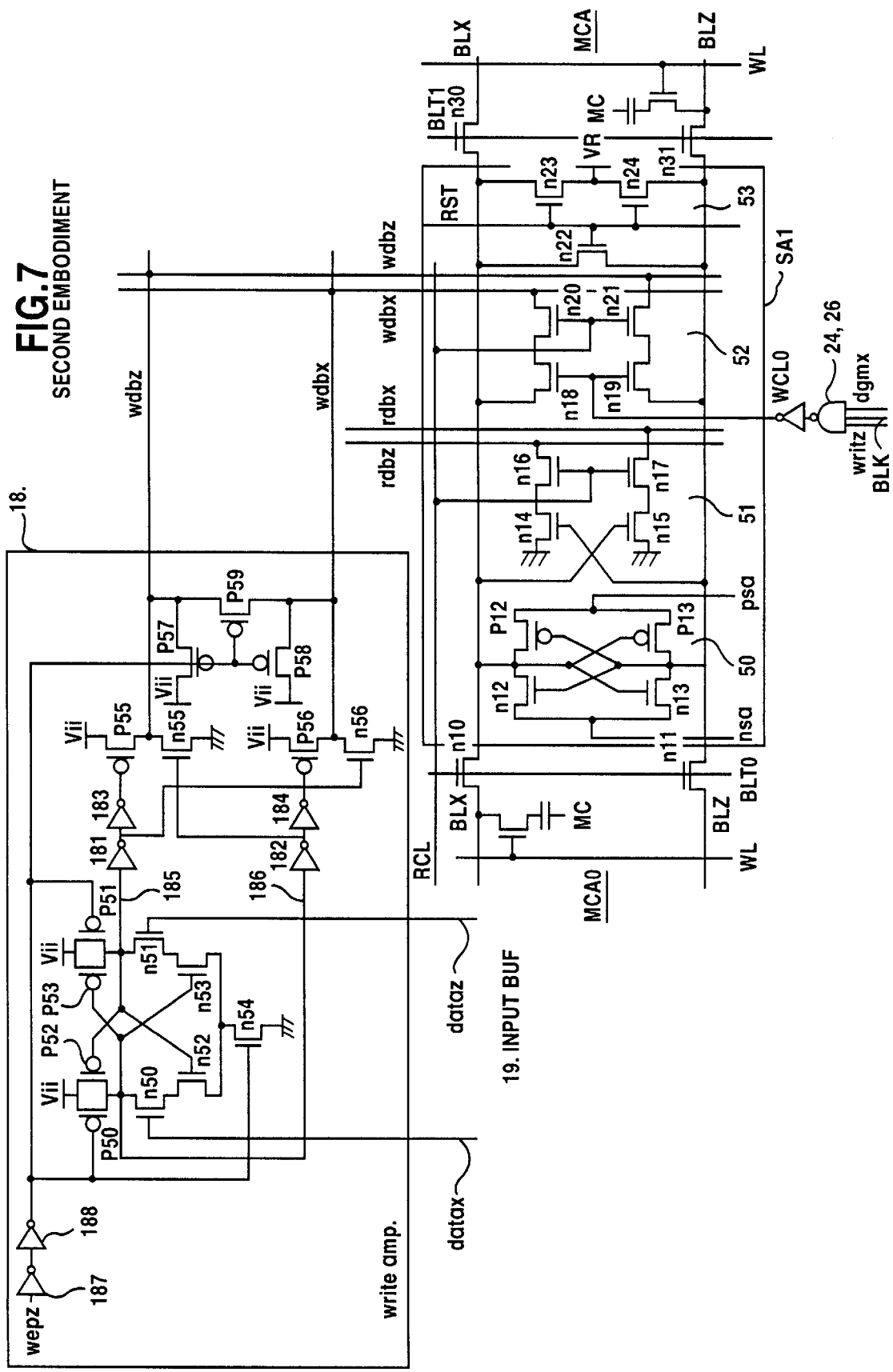
FIG. 7 is a detailed circuit diagram of the second practical embodiment.
Figure 8:
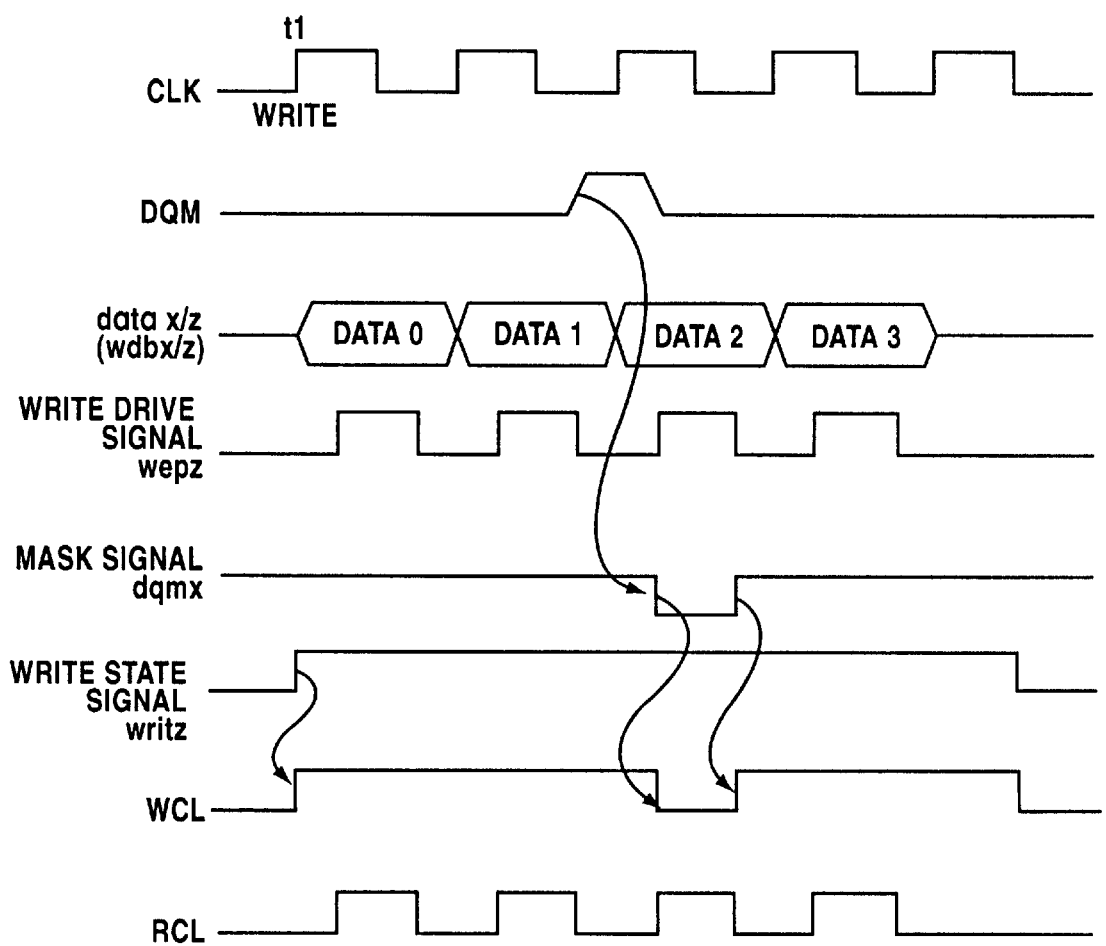
FIG. 8 is a timing chart diagram of the second practical embodiment.

FIG. 7 is a detailed circuit diagram of the second embodiment. FIG. 8 is a timing chart diagram of the second embodiment. In the detailed circuit diagram of FIG. 7, parts that are the same as those in the detailed circuit diagram of FIG. 4 have been given the same reference numbers. As with FIG. 4, in FIG. 7 as well, memory cell arrays MCA0 and MCA1 as well as sense amplifier SA1 installed between them are shown. These circuit structures are the same as those in FIG. 4. Furthermore, write amplifier 18 of FIG. 7 is formed in the same way as that in FIG. 4 except for inverters 187 and 188.

In the detailed circuit diagram shown in FIG. 7, write column selection control circuit 24 and AND circuit 26 shown in FIG. 6 are installed, and the fact that write column selection signal WCL is generated by these circuits differs from the circuit in FIG. 4. Also, write amplifier 18, as described above, drives data buses wrdx and wrdz in response to the high level pulse of write drive signal wepz. This point also differs from the circuit of FIG. 4.

We will explain the operation of the circuit in FIG. 7 while referring to the timing chart diagram of FIG. 8. A write command (write) is input with the timing of the rise of clock CLK at time t1, and write data DATA0 to 3 are supplied synchronous with clock CLK. Thus, write data lines datax and dataz are driven according to write data DATA0 to 3. Also, write drive signal wepz becomes four write drive pulses synchronous with clock CLK. Therefore, write amplifier 18 is activated in response to the write drive signal wepz and write data buses wdbz and wdbz are driven according to the signals of write data lines datax and dataz.

On the other hand, write column selection signal WCL0 which is in a block selected state goes to a selected state (high level) when write state signal writz is in a write state (high level). However, when mask signal dqmx is in a masked state (low level) write column selection signal WCL goes to a non-selected state (low level). Control of the write selection signal WCL0 is performed by write column selection control circuit 24. Also, read column selection signal RCL goes to a selected state (high level) synchronous with clock CLK by column decoder 16.

When write column selection signal WCL0 goes to a masked state (low level) in response to mask signal dqmx, N type transistors n18 and nl9 of write column selection circuit 52 become non-conductive, bit line pairs BLx and BLz to which memory cells are connected are not connected to write data bus wdbx and wdbz, and write operation is prohibited. In the timing chart diagram of FIG. 8, the write operation synchronous with the third clock CLK is prohibited. Then, the logic of I/O mask signal DQM is not inserted into the critical path in which is generated read column selection signal RCL and is formed from the terminal to which clock CLK is supplied, to predecoder 14 and column decoder 16.

In the second embodiment as well, when in the read mode, the output prohibiting operation by the I/O mask signal DQM is performed at output buffer 21 formed on the output side of read main amplifier 20. Or, such output prohibiting operation is also possible by controlling the operation of read main amplifier 20 so as not to be activated. However, the logic of I/O mask signal DQM is not inserted for the generation of read column selection signal RCL. Therefore, delay is not generated for the column selection operation due to I/O mask signal DQM.

Figure 9:
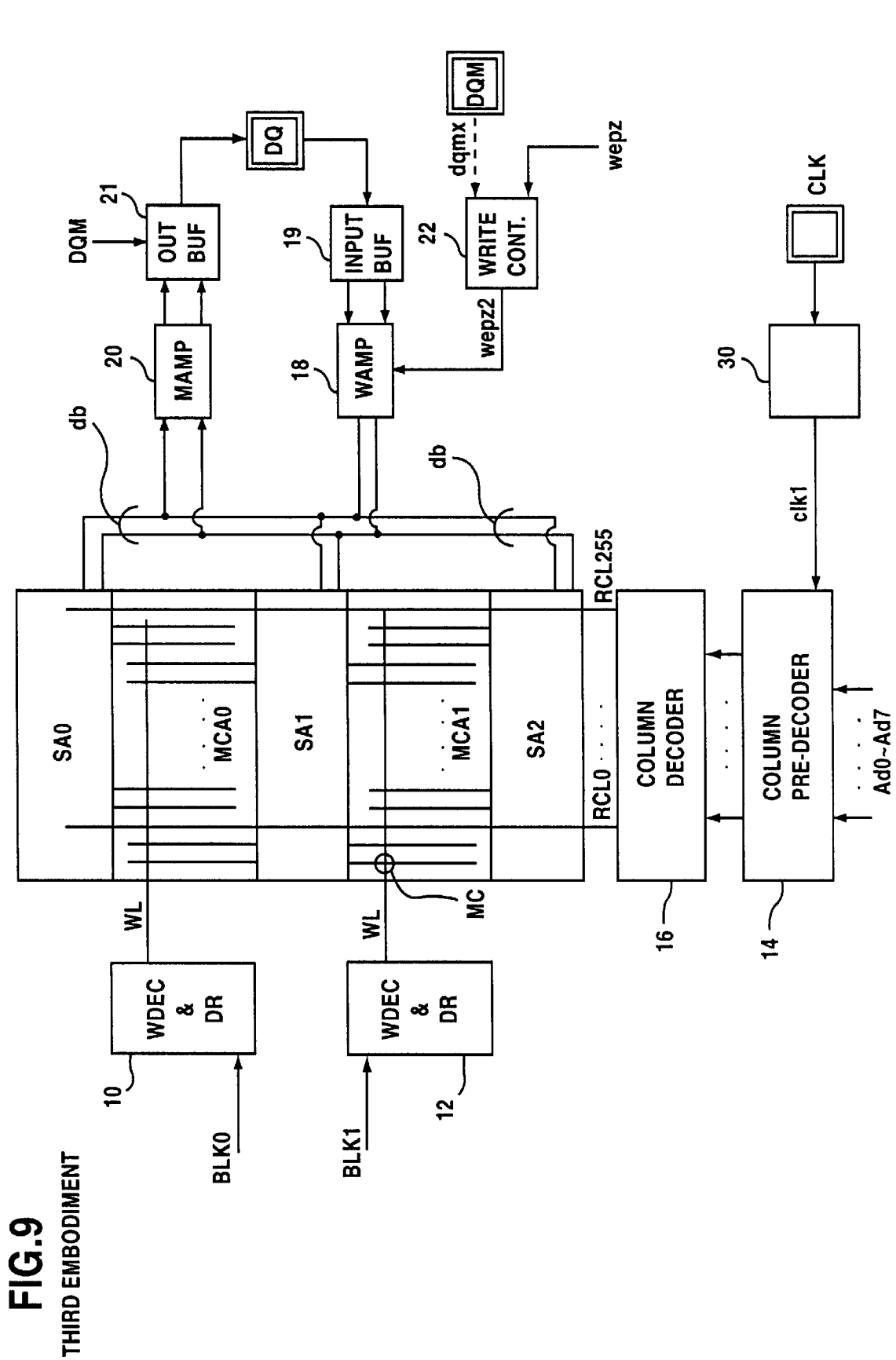
FIG. 9 is an overall circuit diagram of the memory device of a third practical embodiment.

FIG. 9 is an overall circuit diagram of the memory device of a third embodiment. With the third embodiment, column selection signal RCL which can be used for both read and write is generated for each column, respectively. Also, data bus line pairs db are output from each of sense amplifiers SA0 through SA2. These data bus lines pairs are also used for both read and write. Then, read main amplifier 20 and write amplifier 18 are connected to data bus db. In the example shown in FIG. 9, there is no write column selection signal. However, sense amplifiers SA0 and SA2 are driven according to block selection signals BLK0 and BLK1 and sense amplifier SA1 is driven according to a logic OR of the block selection signals BLK0 and BLK1.

Write control circuit 22 is installed to control write prohibition when in the burst write mode, mask signal dqmx generated from I/O mask signal DQM and write control signal wepz are supplied to write control circuit 22, write drive signal wepz2 is generated in response to these, and then supplied to write amplifier 18. The structure is similar to the first embodiment. Other than the points noted above, the third practical embodiment shown in FIG. 9 is the same as the first practical embodiment shown in FIG. 3.

Figure 10:
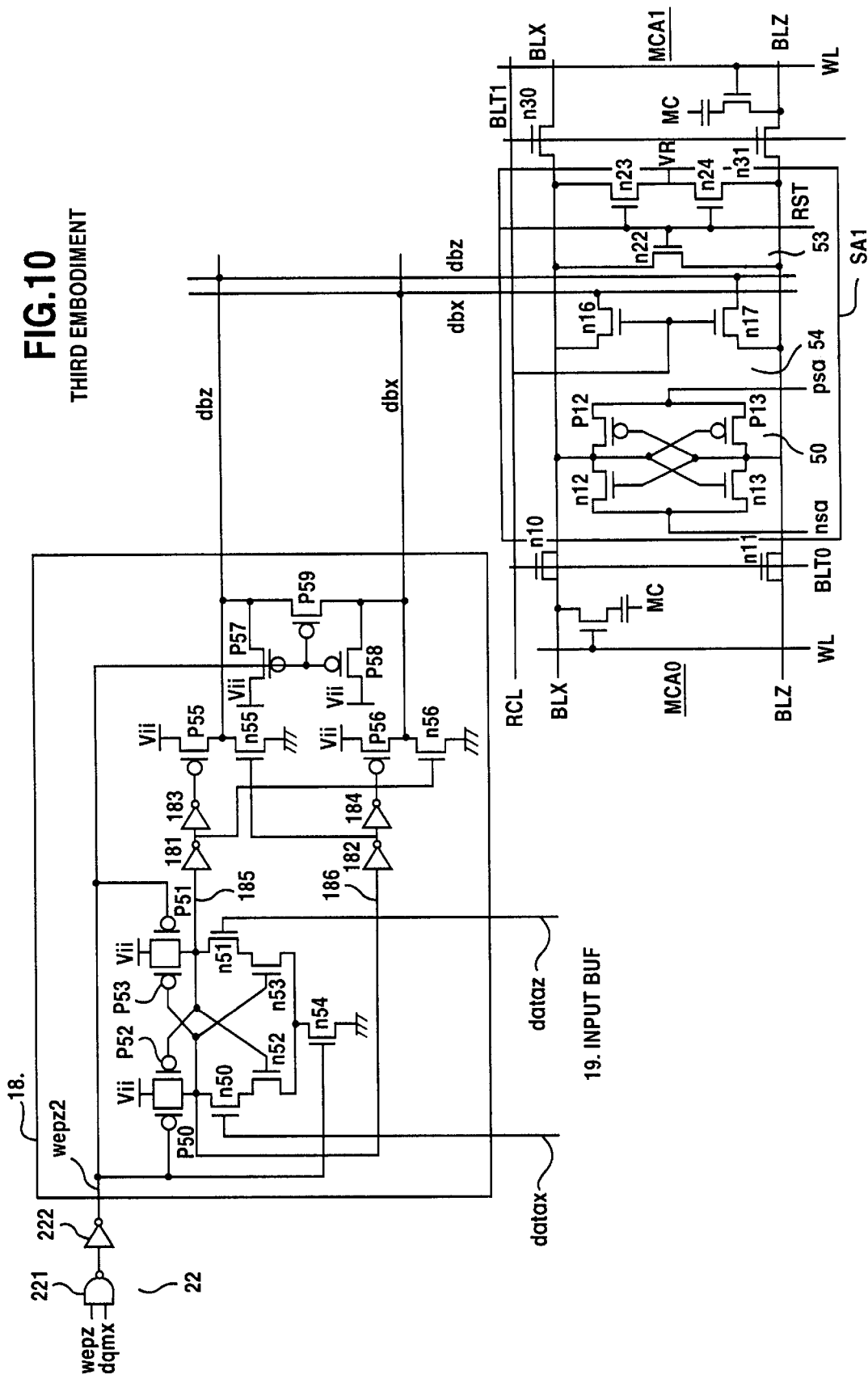
FIG. 10 is a detailed circuit diagram of the third practical embodiment.
Figure 11:
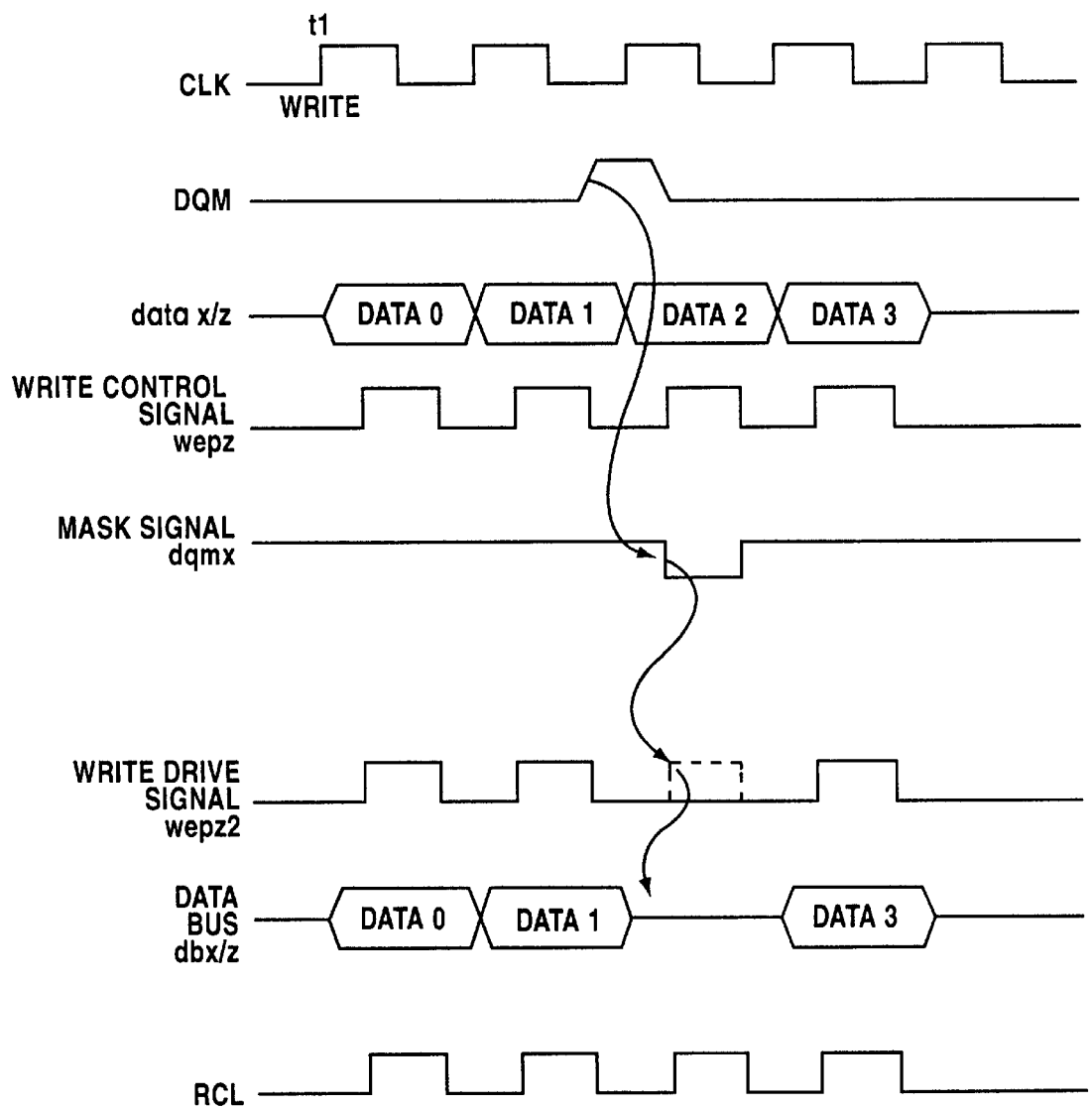
FIG. 11 is a timing chart diagram of the third practical embodiment.

FIG. 10 shows a detailed circuit diagram of the third embodiment. Also, FIG. 11 shows a timing chart diagram of the third embodiment. The sense amplifier circuit SA1 shown in FIG. 10 has amplifier circuit 50 that detects and amplifies potential difference between bit line pairs, reset circuit 53 that shorts bit line pairs using reset signal RST and precharges them to reset level $V_R$, and column selection gate 54 formed from N type transistors n16 and n17 which connects data buses dbx and dbz and bit line pairs BLx and BLz using column selection signal RCL.

As described above, with the third embodiment, column selection signal RCL that can be used for both read and write is generated for each bit line pair by column decoder 16. Then, bit line pairs BLx and BLz amplified by amplifier circuit 50 in sense amplifier circuit SA1 are directly connected to data buses dbx and dbz by the conductance of column gate 54. In other words, with the third embodiment, the sense amplifier is not a direct sense type like that of the aforementioned first and second practical embodiments.

Write amplifier 18 and write control circuit 22 shown in FIG. 10 are equivalent to the circuits shown in FIG. 4 for the first embodiment, and the same reference numbers have been given to the same parts. Write amplifier 18 drives data bus line pairs dbx and dbz based on the write data of write data lines datax and dataz in response to the drive pulse of write drive signal wepz2. Also, write drive signal wepz2 is generated by write control circuit 22. Write control signal wepz and mask signal dqmx which is generated from I/O mask signal DQM are supplied to write control circuit 22 which then generates write drive signal wepz2 in response to the write pulse of write control signal wepz. However, when mask signal dqmx is in a masked state (low level), regardless of the write state (high level) of write control signal wepz, write drive signal wepz2 goes to a non-drive state (low level).

As a result, as shown in FIG. 11, write drive signal wepx2 does not go to high level (drive state) in response to the low level of mask signal dqmx, write amplifier 18 does not become activated, and data buses dbx and dbz are not driven. As a result, write operation for data DATA2 is prohibited.

In the third embodiment as well, the logic of I/O mask signal DQM is not inserted into the critical path that generates column selection signal RCL. When reading, column selection signal RCL is generated synchronous with clock CLK after a short delay. On the other hand, the output prohibition operation during read is performed by adding the logic circuit of I/O mask signal DQM at the output buffer circuit 21 of the output side of main amplifier 20. Or, it is also possible by controlling main amplifier 20 not to be activated in response to I/O mask signal DQM.

Figure 12:
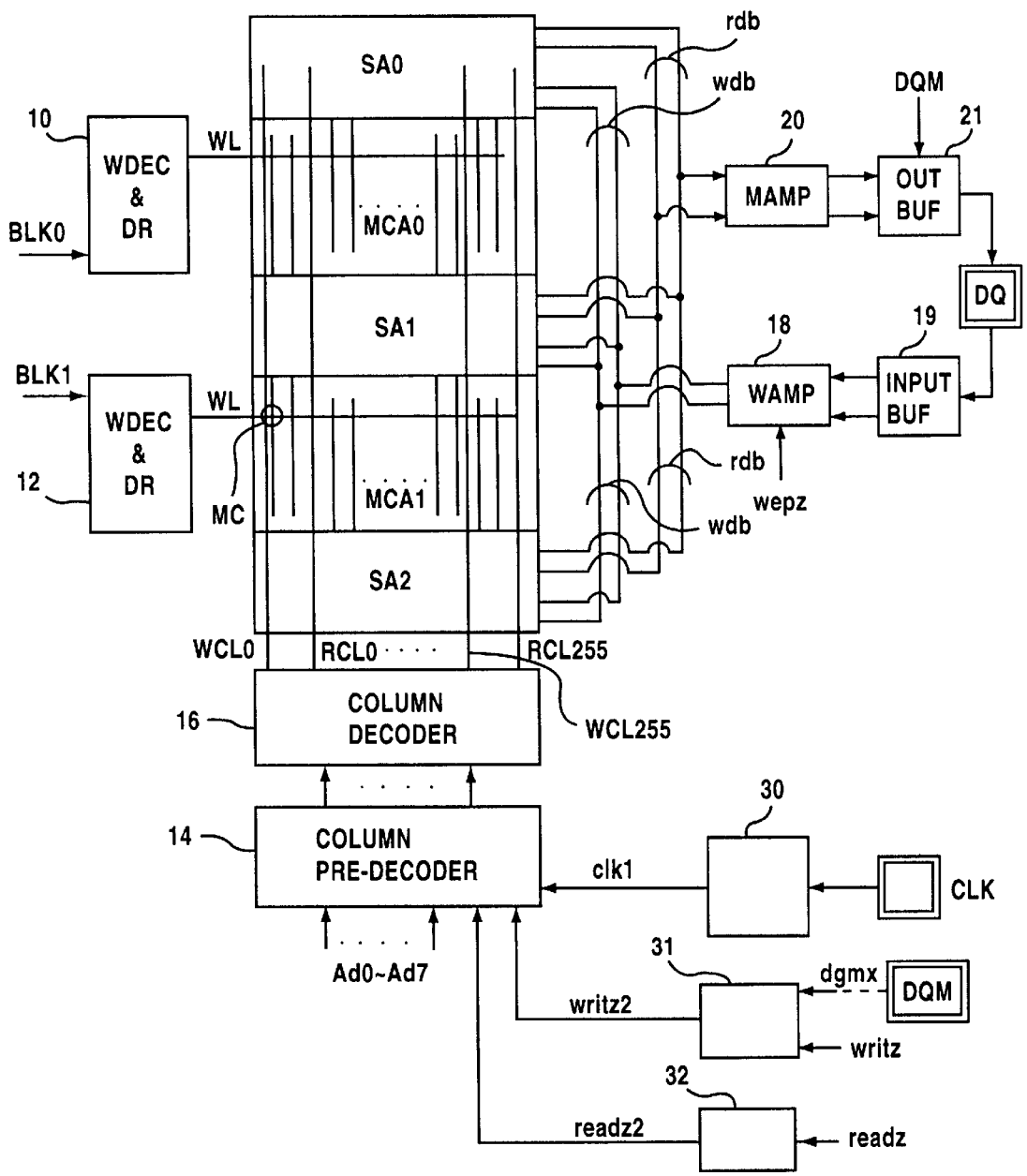
FIG. 12 is an overall circuit diagram of the memory device of a fourth practical embodiment.

FIG. 12 is an overall circuit diagram of a memory device of a fourth embodiment of this invention. With this example, column decoder 16 generates read column selection signal RCL together with write column selection signal WCL for each column. Therefore, column selection during read is performed by read column selection signal RCL, and read data is read via read data bus rdb through main amplifier 20. Also, column selection during write is performed by write column selection signal WCL, and write data is written to memory cells from write amplifier 18 through write data bus wdb.

With the practical embodiment shown in FIG. 4, write amplifier 18 drives write data bus wdb in response to write drive signal wepz. However, the generation of write column selection signal WCL is controlled by write control signal writz2. Write control signal writz2 is generated by write control circuit 31 to which is supplied write state signal writz and mask signal dqmx generated from I/O mask signal DQM. Generation of read column selection signal RCL is controlled by read control signal readz2 generated by read control circuit 32 to which is supplied read state signal readz.

Predecoder circuit 14 and column decoder circuit 16 generate read column selection signal RCL with a timing in response to internal clock clk1 generated by internal clock generating circuit 30 according to clock CLK. As shown in FIG. 12, the control circuit using I/O mask signal DQM is not inserted into the critical path in which read column selection signal RCL is generated.

Figure 13:
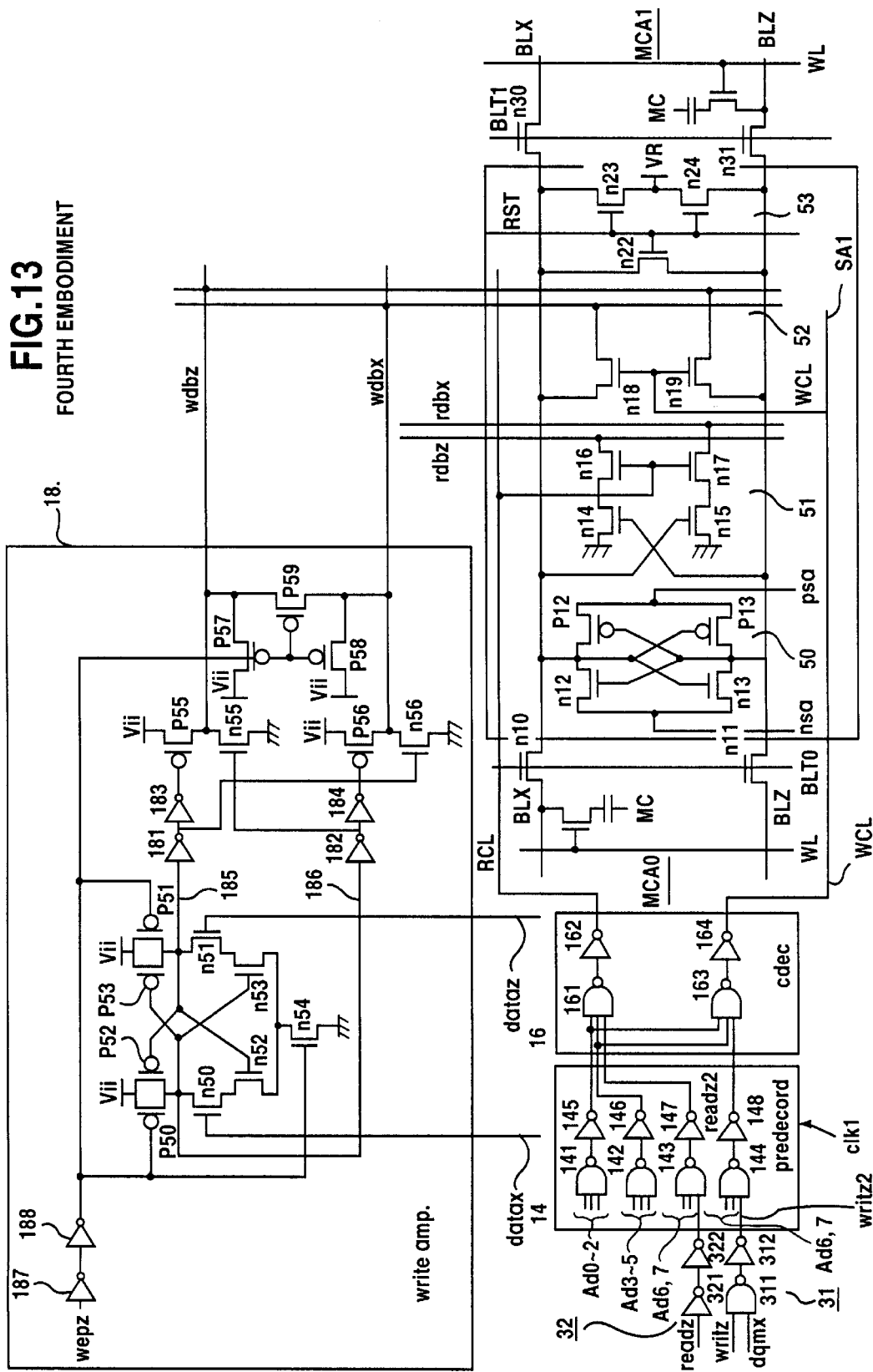
FIG. 13 is a detailed circuit diagram of the fourth practical embodiment.
Figure 14:
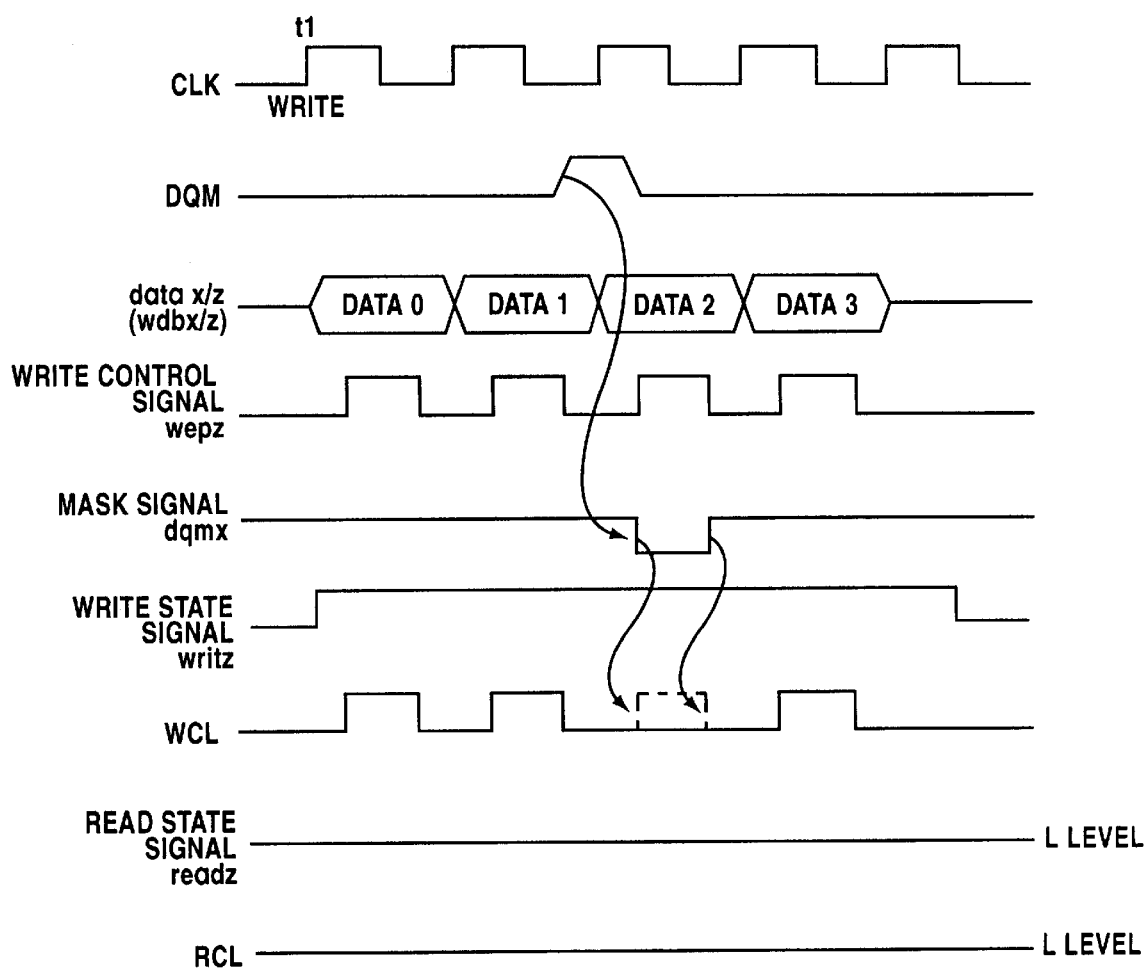
FIG. 14 is a timing chart diagram of the fourth practical embodiment.

FIG. 13 is a detailed circuit diagram of the practical embodiment. FIG. 14 shows a timing chart diagram of the fourth embodiment. As in the circuit example shown in FIG. 3, sense amplifier circuit SA1 shown in FIG. 13 has amplifier circuit 50 formed from transistors p12, p13, n12, and n13, read column selection circuit 51 which has transistors n14 and n15 driven by bit line pairs BLx and BLz and transistors n16 and n17 conducted by read column selection signal RCL, write column selection circuit 52 which has transistors n18 and n19 conducted by write column selection signal WCL, and reset circuit 53. Bit line transfer gates n10, n11, n30, and n31 are the same as in the circuit diagram of FIG. 3.

In this way, with the fourth embodiment, amplifier circuit 50 in the sense amplifier circuit simply drives bit line pairs BLx and BLz, and read data buses rdbx and rdbz are driven by the signals of bit line pairs BLx and BLz via transistors n14 and n15. Therefore, write data buses wdbx and wdbz of a system separate from read are installed, and are connected to bit line pairs BLx and BLz through the conduction of write column selection circuit 52.

Write amplifier 18 is the same as the write amplifier shown in FIG. 7, and drives write data bus wdb based on the level of write data lines datax and dataz in response to the high level pulse of write drive signal wepz.

A characteristic point of the fourth embodiment is that write control circuit 31 to which mask signal dqmx is supplied is installed in the path in which write column selection signal WCL is generated. Specifically, write control circuit 31 is installed on the input side of predecoder circuit 14. This write control circuit 31 has NAND gate 311 to which write state signal writz and mask signal dqmx are supplied as well as inverter 312 which inverts the output thereof. Also, read control circuit 32 is formed from two inverters 321 and 322, and read state signal readz is supplied thereto.

Predecoder circuit 14 includes NAND gate 141 to which column addresses Ad0 to Ad2 are supplied, NAND gate 142 to which column addresses Ad3 to Ad5 are supplied, NAND gate 143 to which column addresses Ad6, Ad7, and read control signal readz2 are supplied, and NAND gate 144 to which column addresses Ad6, Ad7, and write control signal writz2 are supplied.

Then, the output of NAND gates 141, 142, and 143 are supplied to NAND gate 161 within column decoder 16 via inverter 145, 146, and 147. Therefore, column addresses Ad0 to Ad7 are all high level, and when read control signal readz2 is also high level, read column selection signal RCL is generated synchronous with clock CLK. Internal clock clk1 from internal clock generating circuit 30 is supplied to predecoder 14, for example, and output inverters 145 to 148 are activated.

The output of NAND gates 141, 142, and 144 is supplied to NAND gate 163 within column decoder 16 via inverters 145, 146, and 148. Therefore, column addresses Ad0 to Ad7 are all high level, write control signal writz2 is also high level, and write column selection signal WCL is generated synchronous with clock CLK. Activation of output inverters 145 to 148 by internal clock clk1 is as described above.

We will explain operation during 4-bit burst write mode according to the timing chart diagram of FIG. 14. When write command write is given synchronous with the rise of clock CLK at time t1, write data DATA0 to 3 is supplied in succession from the rising edge thereof. Write amplifier 18 simply drives write data buses wdbx and wdbz synchronous with write drive signal wepz.

On the other hand, when I/O mask signal DQM is supplied at the third clock cycle, internal mask signal dqmx goes to low level in response to that. While the write control circuit 31, according to the write state (high level) of write state signal writz, makes write control signal writz2 at high level which makes possible the generation of write column selection signal WCL corresponding to the selected column, but with low level of mask signal dqmx, write control signal writz2 temporarily goes to low level. This prohibits output of high level of write column signal WCL (broken line in FIG. 14).

When write column selection signal WCL is in a selected state (high level), write column selection circuit 52 becomes conductive, and write data buses wdbx and wdbz are connected to bit line pairs BLx and BLz. Because of this, memory cells connected to bit lines are directly driven by write amplifier 18.

On the other hand, when the temporary change to high level (selected state) of write column selection signal WCL by mask signal dqmx is prohibited, connection of write data buses wdbx and wdbz to bit line pairs BLx and BLz is prohibited, and write is prohibited.

During read, the corresponding read column selection signal RCL goes to high level, and by read column selection circuit 51, bit line pairs BLx and BLz drive transistors n14 and n15, and read data buses rdbx and rdbz are driven. Then, as shown in FIG. 12, at the output buffer circuit on the output side of main amplifier 20, control is performed by I/O mask signal DQM, and read operation is prohibited as necessary.

For the aforementioned embodiment, the column selection signal during read is generated to be synchronous with the rise of clock CLK. To do this, as an example, as shown in FIG. 13, the activation of the predecoder (14) output inverter is performed by internal clock clk1 generated from clock CLK. Then, the logic circuit due to I/O mask signal DQM is not inserted into the signal path in which read column selection signal RCL is generated for predecoder 14 and column decoder 16. Therefore, it is possible to accelerate the generation of read column selection signal RCL which is related to the acceleration of the read operation.

Then, for the burst write mode, the selected state of write column selection signal WCL is prohibited by I/O mask signal DQM, or the drive operation of the write amplifier is prohibited by I/O mask signal DQM. Also for the burst read mode, output of the read main amplifier is prohibited by I/O mask signal DQM or main amplifier drive is prohibited by I/O mask signal DQM.

As described above, with this invention, since the operation of prohibiting input for the burst write mode is performed by prohibiting drive to the non-selected state of the write column selection signal or prohibiting write drive of the write amplifier, it is no longer necessary to insert a logic circuit using an I/O mask signal to the path in which the read column selection signal is generated. Therefore, it is possible to accelerate read operation.

What is claimed is:

1. A memory device having a burst mode that performs write and read of multiple bits synchronous with a clock, comprising:

a memory cell array including plural memory cells for storing data and plural bit lines connectable thereto;

a sense amplifier that detects and amplifies the electric potential of said bit lines;

a first column selection circuit that is driven according to said bit line electric potential, and that is opened or closed by a first column selection signal generated for each of said bit lines;

a first data bus provided in common with said plural bit lines, and driven by said first column selection circuit;

a read main amplifier connected to said first data bus;

a second column selection circuit that is opened or closed by said first column selection signal;

a second data bus provided in common with said plural bit lines via said second column selection circuit; and a write amplifier that, in synchronous with said clock, drives said second data bus according to the written data so as to perform a write operation to said memory cells; and wherein, in said burst write mode, said write amplifier is prohibited from driving said second data bus in response to a mask signal that requests prohibition of predetermined write operations.

2. A memory device having a burst mode that performs write and read of multiple bits synchronous with a clock, comprising:

a memory cell array including plural memory cells for storing data and plural bit lines connectable thereto;

a sense amplifier that detects and amplifies the electric potential of said bit lines;

a first column selection circuit that is driven according to said bit line electric potential, and that is opened or closed by a first column selection signal generated for each of said bit lines;

a first data bus provided in common with said plural bit lines, and driven by said first column selection circuit;

a read main amplifier connected to said first data bus, a second column selection circuit that is opened or closed by said first column selection signal and a second column selection signal;

a second data bus provided in common with said plural bit lines via said second column selection circuit; and a write amplifier that, in synchronous with said clock, drives said second data bus according to the written data so as to perform write operation to said memory cells via said open second column selection circuit;

wherein, in said burst write mode, said second column selection signal is controlled so that said second column selection circuit be closed in response to a mask signal that requests prohibition of predetermined write operations.

3. A memory device having a burst mode that performs write and read of multiple bits synchronous with a clock, comprising:

a memory cell array including plural memory cells for storing data and plural bit lines connectable thereto;

a data bus provided in common to said plural bit lines via a column gate that is opened or closed by a column selection signal; and a write amplifier that, in synchronous with said clock, drives said data bus according to the written data so as to perform write operation to said memory cells;

wherein, in said burst write mode, said write amplifier is prohibited from driving said data bus in response to a mask signal that requests prohibition of predetermined write operations.

4. A memory device having a burst mode that performs write and read of multiple bits synchronous with a clock, comprising:

a memory cell array including plural memory cells for storing data and plural bit lines connectable thereto;

a sense amplifier that detects and amplifies the electric potential of said bit lines;

a first column selection circuit that is driven according to said bit line electric potential, and that is opened or closed by a first column selection signal generated for each of said bit lines during read operation;

a first data bus provided in common with said plural bit lines, and driven by said first column selection circuit;

a read main amplifier connected to said first data bus;

a second column selection circuit that is opened or closed by a second column selection signal generated for each of said bit lines during write operation;

a second data bus provided in common with said plural bit lines via said second column selection circuit; and a write amplifier that, in synchronous with said clock, drives said second data bus according to the written data so as to perform write operation to said memory cells via said open second column selection circuit; and wherein, in said burst write mode, said second column selection signal is controlled so that said second column selection circuit be closed in response to a mask signal that requests prohibition of predetermined write operations.

5. A memory device having a burst mode that performs write and read of multiple bits synchronous a the clock, comprising:

a memory cell array including plural memory cells for storing data and plural bit lines connectable thereto;

a first column selection circuit that is opened or closed by a first column selection signal generated for each of the aforementioned bit lines;

a first data bus provided in common with the plural bit lines via the first column selection circuit;

a read main amplifier connected to the first data bus;

a second column selection circuit that is opened or closed by a second column selection signal generated during write operation;

a second data bus provided in common with the plural bit lines via the second column selection circuit; and a write amplifier that, in synchronous with the clock, drives the second data bus according to the written data so as to perform a write operation to the memory cells via the open second column selection circuit, wherein, in the burst write mode, the second column selection signal controls the second column selection circuit to be closed in response to a mask signal that requests prohibition of predetermined write operations.

6. The memory device according to claim 5, wherein:

said second column selection signal is supplied in a word direction that intersects said bit lines, and said second column selection circuit is controlled to open or close by said second column selection signal and said first column selection signal.

7. The memory device according to claim 5, wherein:

said second column selection signal is generated for each of said bit lines during write operation, and said first column selection signal is generated for each of said bit lines during read operation.

8. The memory device according to claims 5 through 7, wherein:

said first column selection signal is generated synchronous to said clock, and the logic of said mask signal is not inserted into the circuit in which the signal is generated.

9. A memory device which has a burst mode that performs write and read of multiple bits synchronous with a clock, comprising:

a memory cell array including plural memory cells for storing data and plural bit lines connectable thereto;

a data bus provided in common with the plural bit lines via a column gate that is opened or closed by a column selection signal;

a read main amplifier connected to the data bus; and a write amplifier that, in synchronous with the clock, drives the data bus according to the written data so as to perform a write operation to the memory cells, wherein the write amplifier, in a burst write mode, is prohibited from driving the data bus in response to a mask signal that requests prohibition of a predetermined write operation, and the read main amplifier, in a burst read mode, is prohibited from outputting the read data in response to the mask signal.

10. The memory device according to claim 9, wherein:

said column selection signal is generated synchronous with said clock and the logic of said mask signal is not inserted into the circuit in which the signal is generated.

* * * * *

UNITED STATES PATENT AND TRADEMARK OFFICE
CERTIFICATE OF CORRECTION

PATENT NO. : 6,072,749
DATED : June 6, 2000
INVENTOR(S) : NAKAMURA et al.

It is certified that error appears in the above-indentified patent and that said Letters Patent is hereby corrected as shown below:

On the title page, item [54], and Column 1:

Item [54], please delete "MEMORY DEVICE PREVENTING A SLOW OPERATION THROUGH A MASK SIGNAL", and insert --MEMORY DEVICE PREVENTING A SLOW READ OPERATION THROUGH A MASK SIGNAL--

Signed and Sealed this

Third Day of April, 2001

Attest:

NICHOLAS P. GODICI

Attesting Officer    Acting Director of the United States Patent and Trademark Office